United States Patent
Yu et al.

(10) Patent No.: US 11,430,889 B2
(45) Date of Patent: Aug. 30, 2022

(54) JUNCTIONLESS FIELD-EFFECT TRANSISTOR HAVING METAL-INTERLAYER-SEMICONDUCTOR STRUCTURE AND MANUFACTURING METHOD THEREOF

(71) Applicant: Korea University Research and Business Foundation, Seoul (KR)

(72) Inventors: Hyun-Yong Yu, Seoul (KR); Seung Geun Jung, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/524,585

(22) Filed: Jul. 29, 2019

(65) Prior Publication Data

US 2020/0035830 A1 Jan. 30, 2020

(30) Foreign Application Priority Data

Jul. 30, 2018 (KR) .................. 10-2018-0088790

(51) Int. Cl.
| | |
|---|---|
| H01L 29/78 | (2006.01) |
| H01L 29/51 | (2006.01) |
| H01L 29/66 | (2006.01) |
| H01L 29/47 | (2006.01) |
| H01L 21/02 | (2006.01) |

(52) U.S. Cl.
CPC ...... *H01L 29/7839* (2013.01); *H01L 21/0228* (2013.01); *H01L 21/02175* (2013.01); *H01L 29/47* (2013.01); *H01L 29/517* (2013.01); *H01L 29/66477* (2013.01)

(58) Field of Classification Search
CPC .............. H01L 29/517; H01L 29/7839; H01L 2924/13086; H01L 29/6646; H01L 29/1025–1033; H01L 29/45–47; H01L 29/7838; H01L 21/02172–02175; H01L 29/6647

See application file for complete search history.

(56) References Cited

U.S. PATENT DOCUMENTS

2016/0043191 A1* 2/2016 Haverty .............. H01L 29/0895
257/288
2019/0081102 A1* 3/2019 Park .................... H01L 23/5226
(Continued)

FOREIGN PATENT DOCUMENTS

| CN | 104269438 A | 1/2015 | |
|---|---|---|---|
| CN | 107068734 A * | 8/2017 | ......... H01L 29/0657 |

(Continued)

OTHER PUBLICATIONS

Englsh translation of CN 107068734 A Aug. 2017.*
(Continued)

*Primary Examiner* — Latanya N Crawford Eason
(74) *Attorney, Agent, or Firm* — NSIP Law

(57) ABSTRACT

A semiconductor component is disclosed. The semiconductor component can include: a semiconductor layer injected with a same type of dopant; a gate electrode formed above the semiconductor layer with a gate insulation film positioned in-between; a dielectric layer formed on the semiconductor layer at both sides of the gate electrode; and source/drain electrodes each formed on the dielectric layer.

16 Claims, 23 Drawing Sheets

(56) References Cited

U.S. PATENT DOCUMENTS

2019/0165103 A1* 5/2019 Lu ................... H01L 21/28194
2020/0013791 A1* 1/2020 Or-Bach ............ G11C 16/0416

FOREIGN PATENT DOCUMENTS

| GB | 2479893 A * | 2/2011 | ............. H01L 29/66 |
| KR | 10-1784489 B1 | 10/2017 | |
| KR | 10-1795826 B1 | 11/2017 | |

OTHER PUBLICATIONS

GB 2479893 A.*
Geun Jung, Seung et al., Effects of Metal-Interlayer-Semiconductor Source/Drain Contact Structure on n-Type Germanium Junctionless FinFETs, *IEEE Transactions on Electron Devices*, vol. 65, Issue: 8, May 1, 2018 (pp. 1-6).

* cited by examiner

\* MS contact in off state

\* MS contact in on state

* MIS contact in off-state

JUNCTIONLESS FIELD-EFFECT TRANSISTOR HAVING METAL-INTERLAYER-SEMICONDUCTOR STRUCTURE AND MANUFACTURING METHOD THEREOF

CROSS-REFERENCE TO RELATED APPLICATIONS

This application claims the benefit of Korean Patent Application No. 10-2018-0088790, filed with the Korean Intellectual Property Office on Jul. 30, 2018, the disclosure of which is incorporated herein by reference in its entirety.

BACKGROUND

1. Technical Field

The present invention relates to a junctionless field-effect transistor and a method of manufacturing the transistor, more particularly to a junctionless field-effect transistor having a metal-interlayer-semiconductor structure applied to the source/drain region and a manufacturing method thereof.

2. Description of the Related Art

Semiconductor components currently in the market such as the MOSFET (Metal-Oxide-Semiconductor FET) or the FinFET include a gate for forming a channel through which electric currents may flow as well as a source and a drain that transfer the current through the channel. However, as limits in scaling down component sizes make precision processing of the source and drain difficult and degrade switching characteristics, the junctionless field-effect transistor has been developed to resolve these issues.

In a junctionless field-effect transistor, the doping of the source/drain is obviated, so that the doping concentration is the same over all of the semiconductor regions of the component, and also the effective channel length is relatively longer, so that the switching characteristics are greatly improved. A junctionless field-effect transistor can adjust the size of the depletion layer region of the channel through the gate work function, and as such, the semiconductor component can be manufactured in a very small thickness (about 20 nm or lower) or in the form of a nanowire.

However, semiconductor components need to have a lower contact resistance at the source/drain region to decrease a power consumption. And the same applies also to the junctionless field-effect transistor.

SUMMARY OF THE INVENTION

An objective of the invention is to provide a junctionless field-effect transistor and a manufacturing method thereof, where a metal-interlayer-semiconductor structure is applied to the junctionless field-effect transistor to achieve a low contact resistance and to enable the junctionless field-effect transistor to operate in an enhancement mode by reducing the current leakage caused by a high Schottky barrier at the source/drain.

A semiconductor component according to an embodiment of the invention can include: a semiconductor layer injected with a same type of dopant; a gate electrode formed above the semiconductor layer with a gate insulation film positioned in-between; a dielectric layer formed on the semiconductor layer at both sides of the gate electrode; and source/drain electrodes each formed on the dielectric layer.

A method of manufacturing a semiconductor component according to an embodiment of the invention can include: forming a gate structure on a semiconductor layer that is injected with a same type of dopant; forming a dielectric layer on the semiconductor layer on both sides of the gate structure; and forming source/drain electrodes on the dielectric layer.

An embodiment of the invention can reduce current leakage caused by a high Schottky barrier at the source/drain to thereby allow a junctionless field-effect transistor to operate in an enhancement mode.

Also, the source/drain contact can be made to have a low contact resistance as low-temperature processes are used.

Additional aspects and advantages of the present invention will be set forth in part in the description which follows, and in part will be obvious from the description, or may be learned by practice of the invention.

DETAILED DESCRIPTION OF THE INVENTION

Disclosed hereinafter are exemplary embodiments of the present invention. Particular structural or functional descriptions provided for the embodiments hereafter are intended merely to describe embodiments according to the concept of the present invention. The embodiments are not limited as to a particular embodiment.

Terms such as "first" and "second" may be used to describe various parts or elements, but the parts or elements should not be limited by the terms. The terms may be used to distinguish one element from another element. For instance, a first element may be designated as a second element, and vice versa, while not departing from the extent of rights according to the concepts of the present invention.

Unless otherwise clearly stated, when one element is described, for example, as being "connected" or "coupled" to another element, the elements should be construed as being directly or indirectly linked (i.e., there may be an intermediate element between the elements). Similar interpretation should apply to such relational terms as "between", "neighboring," and "adjacent to."

Terms used herein are used to describe a particular exemplary embodiment and should not be intended to limit the present invention. Unless otherwise clearly stated, a singular term denotes and includes a plurality. Terms such as "including" and "having" also should not limit the present invention to the features, numbers, steps, operations, subparts and elements, and combinations thereof, as described; others may exist, be added or modified. Existence and addition as to one or more of features, numbers, steps, etc. should not be precluded.

Unless otherwise clearly stated, all of the terms used herein, including scientific or technical terms, have meanings which are ordinarily understood by a person skilled in the art. Terms, which are found and defined in an ordinary dictionary, should be interpreted in accordance with their usage in the art. Unless otherwise clearly defined herein, the terms are not interpreted in an ideal or overly formal manner.

Hereinafter, exemplary embodiments of the present invention are described in detail with reference to the accompanying drawings.

Figure 1:
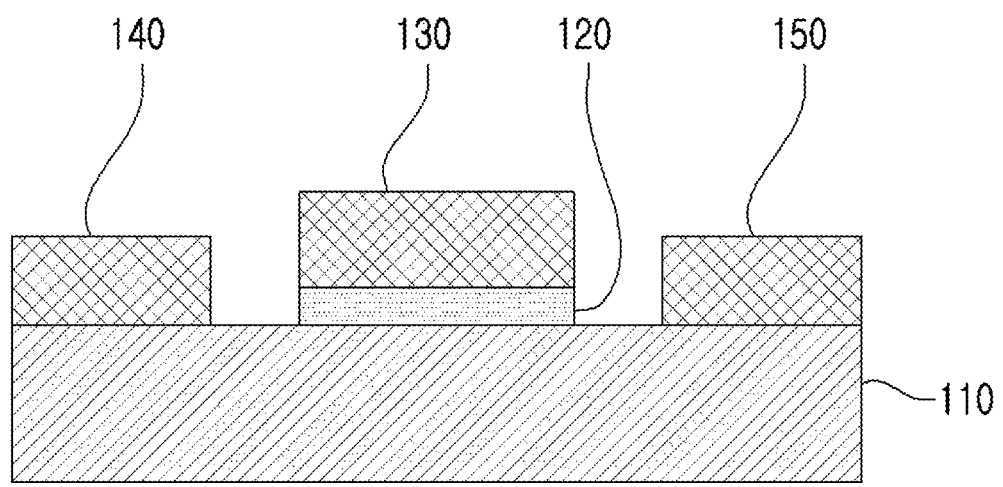
FIG. 1 is a cross-sectional view of a junctionless field-effect transistor structure.

FIG. 1 is a cross-sectional view of a junctionless field-effect transistor structure.

Referring to FIG. 1, a junctionless field-effect transistor 100 may include a semiconductor substrate 110, a gate insulation film 120, a gate electrode 130, and source/drain electrodes 140, 150.

A "junctionless field-effect transistor" mentioned in the present specification refers to any type of structure which, unlike the conventional field-effect transistor where a separate source/drain region is formed in a silicon substrate with a different conductivity type, has source/drain electrodes 140, 150 electrically connected onto an activation layer doped with the same conductivity type without forming a separate source/drain region, so that there is no doped pn junction in the channel within the boundary of the transistor.

The junctionless field-effect transistor 100 can include a gate electrode 130 formed above a semiconductor layer 110 with a gate insulation film 120 positioned in-between and source/drain electrodes 140, 150 formed on the semiconductor substrate 110 on both sides of the gate electrode 130. And, the junctionless field-effect transistor 100 can further include spacers on both side surfaces of the gate electrode 130 for preventing contact between the gate electrode 130 and other elements.

Here, the semiconductor substrate 110 can be a SOI (silicon on insulator) substrate, for example, and can include a buried insulation film and an activation layer. Here, the activation layer may overall be composed of a single dopant injected with an impurity of the same type (n type or p type), so that there may be no separate junction region formed in the junctionless field-effect transistor 100. The activation layer can also be formed by injecting a dopant of the same type in the same concentration.

In the junctionless field-effect transistor 100 also, a phenomenon resulting from contact between a metal layer and a semiconductor layer occurs, similarly to the conventional field-effect transistor. A more detailed description is provided with reference to FIG. 2 and FIG. 3.

Figure 2:
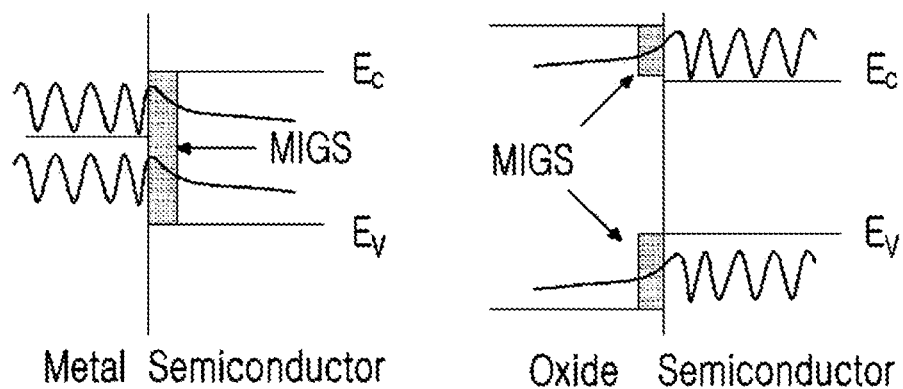
FIG. 2 is a diagram illustrating MIGS (metal-induced gap states).

FIG. 2 is a diagram illustrating MIGS (metal-induced gap states).

Referring to FIG. 2, when a metal-semiconductor interface is formed in a semiconductor component, MIGS are occurred. MIGS refer to states in which electrons can exist in the semiconductor band gap due to wave function penetration by electrons within the metal when a semiconductor and a metal are joined. Such MIGS induce changes in state density at the interface part and thus enforces the Fermi-level pinning phenomenon, which describes the Fermi level at the semiconductor surface being fixed near the CNL (charge neutrality level), a unique property of the semiconductor.

Figure 3:
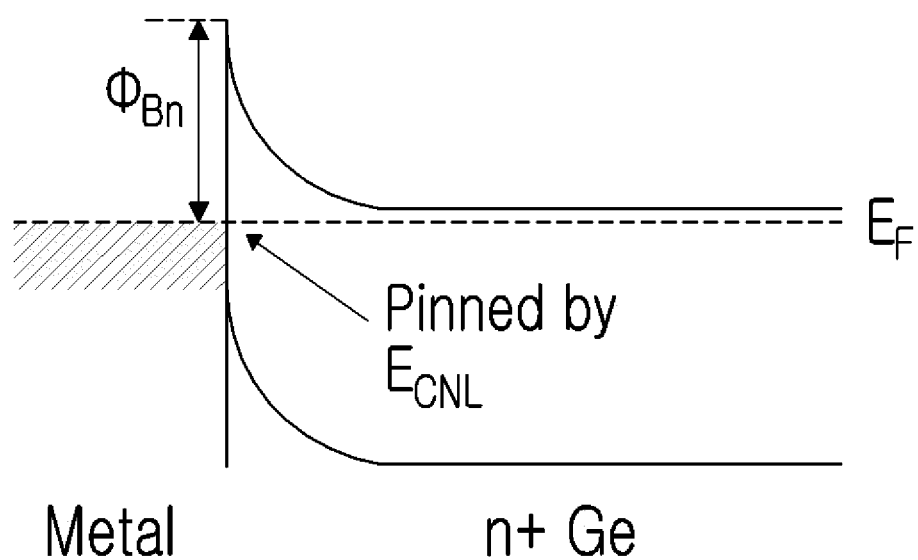
FIG. 3 is a diagram illustrating the Schottky barrier, which occurs in a metal-semiconductor structure.

FIG. 3 is a diagram illustrating the Schottky barrier, which occurs in a metal-semiconductor structure.

Referring to FIG. 3, an actual semiconductor component differs from an ideal case in that the Fermi-level pinning phenomenon causes the forming of an electron Schottky barrier in the metal-semiconductor structure. In cases where the semiconductor is germanium (Ge) or silicon (Si) in particular, Fermi-level pinning is more pronounced when the semiconductor contacts metal. Accordingly, the CNL is positioned at the side of the valence band, forming a high Schottky barrier.

Figure 4A:
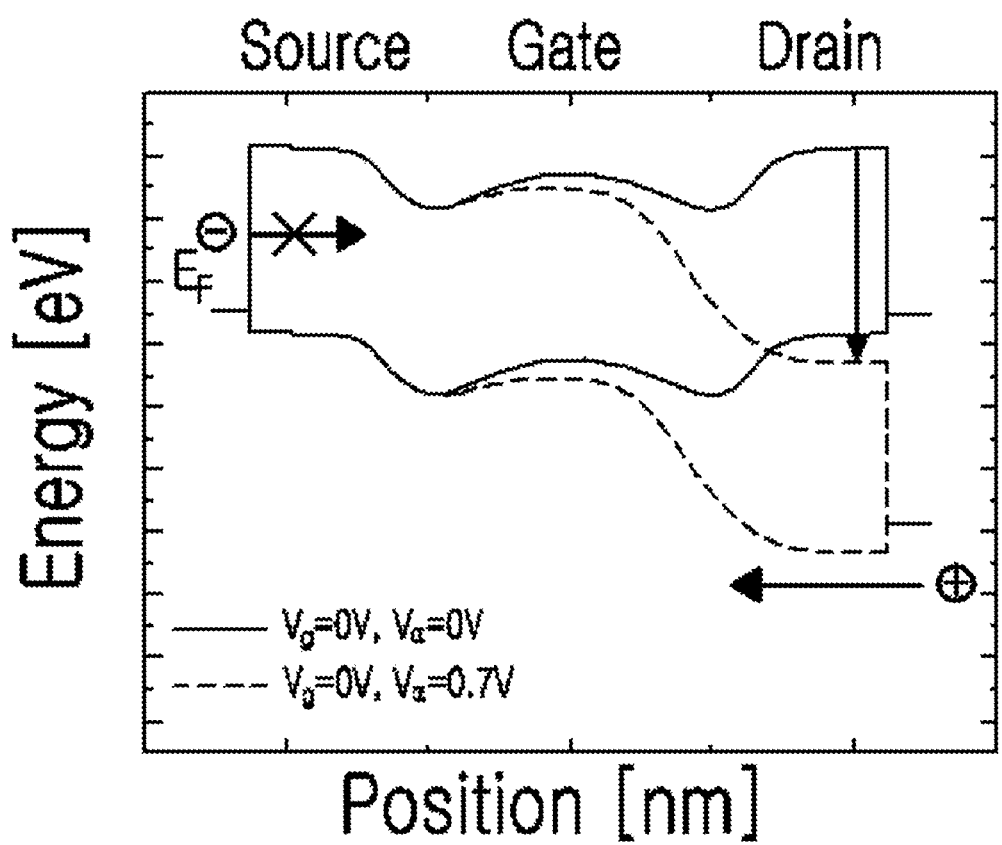
FIG. 4A and FIG. 4B show energy band diagrams of an n-type semiconductor-based junctionless field-effect transistor illustrated in FIG. 1 according to operation.
Figure 4B:
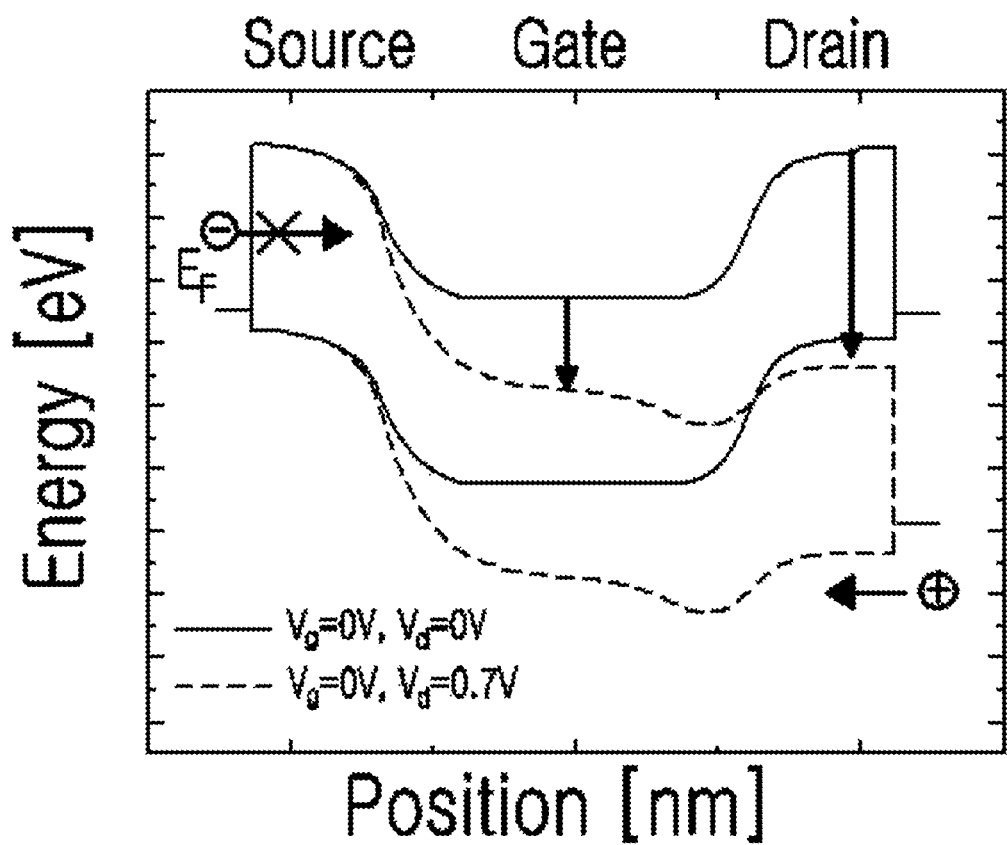

FIGS. 4A and 4B show energy band diagrams of an n-type semiconductor-based junctionless field-effect transistor illustrated in FIG. 1 according to operation.

Referring to FIGS. 4A and 4B, when there is no bias voltage applied to the gate so that the transistor is in an off mode (FIG. 4A), an increase in the Schottky barrier at the metal-semiconductor interface causes the difference in energy barriers between the gate and the source/drain to be reduced, resulting in increased current leakage.

On the other hand, when a bias voltage is applied to the gate and the transistor is in an on mode (FIG. 4B), the energy barrier of the gate acts as a barrier for holes at the drain, resulting in a decreased operating current.

While the increased current leakage may not be as high as for the Schottky barrier occurring in the n-type semiconductor described above, the junctionless field-effect transistor based on the p-type semiconductor also experiences current leakage due to the forming of the Schottky barrier.

To resolve the problems of the conventional junctionless field-effect transistor described above, an aspect of the present invention proposes a junctionless field-effect transistor that adopts a metal-interlayer-semiconductor structure.

Figure 5:
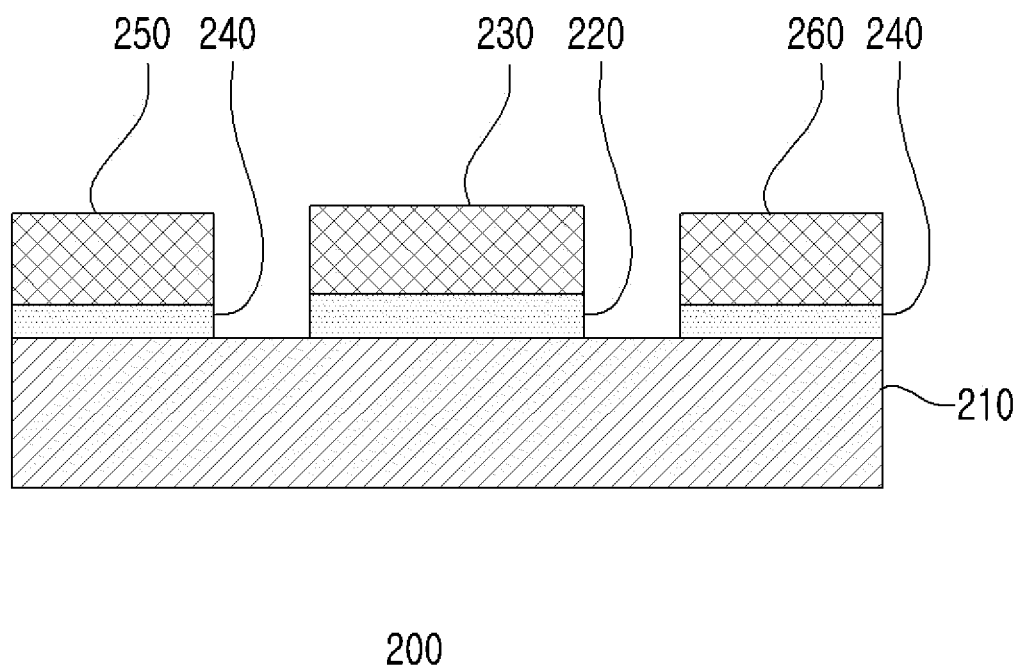
FIG. 5 is a cross-sectional view of a junctionless field-effect transistor structure according to an embodiment of the invention.

FIG. 5 is a cross-sectional view of a junctionless field-effect transistor structure according to an embodiment of the invention.

Referring to FIG. 5, a junctionless field-effect transistor 200 according to an embodiment of the invention may include a semiconductor layer 210, a gate insulation film 220, a gate electrode 230, a dielectric layer 240, and source/drain electrodes 250, 260.

The semiconductor layer 210 can include a group IV semiconductor containing a group 4 element such as carbon (C), silicon (Si), and germanium (Ge) or a combination thereof, a group IV-IV compound semiconductor such as silicon germanium (SiGe) or silicon carbide (SiC), etc., a group III-V compound semiconductor such as gallium arsenide (GaAs), indium arsenide (InAs), indium phosphide (InP), etc., and the like.

The semiconductor layer 210 can refer to the activation layer in a SOI (silicon on insulator) substrate that includes a buried insulation film and an activation layer. Here, the semiconductor layer 210 may be made of a single dopant injected overall with the same type of impurity (n type or p type) and, as such, may not form a separate junction region. For example, in the case of an n-type semiconductor, a group V element can be the dopant. Furthermore, the semiconductor layer 210 can also be formed by injecting the same type of dopant in the same concentration.

The semiconductor layer 210 may preferably be configured to have a doping concentration that exhibits optimum switching characteristics and contact resistance according to the materials of the metal layer and semiconductor layer 210, in consideration of the subthreshold voltage swing, which represents the drain current at the subthreshold region, and contact resistance.

The gate electrode 230 may be formed above the semiconductor layer 210 with a gate insulation film 220 positioned in-between. Namely, the gate insulation film 220 may be formed on the semiconductor layer 210, and the gate electrode 230 may be formed on the gate insulation film 220.

However, in contrast to the conventional junctionless field-effect transistor in which the source/drain electrodes 250, 260 are formed immediately on the semiconductor layer 210 at both sides of the gate electrode 230, a dielectric layer 240 may be formed as an interlayer.

The dielectric layer 240 may be inserted between the semiconductor layer 210 and each of the source/drain electrodes 250, 260 on both sides of the gate electrode 230. The inserting of the dielectric layer 240 may be performed over the semiconductor layer 210 on both sides of the gate electrode 230. The insertion of the dielectric can be performed with any of a variety of deposition processes such as ALD (atomic layer deposition), CVD (chemical vapor deposition), LPCVD (low pressure CVD), APCVD (atmospheric pressure CVD), LTCVD (low temperature CVD), PECVD (plasma-enhanced CVD), ALCVD (atomic layer CVD), and PVD (physical vapor deposition). Since high-temperature processing can incur thermal degradation in the semiconductor component to decrease its performance, it can be preferable to deposit the dielectric layer 240 by way of an ALD process, with which low-temperature processing is possible.

The dielectric layer 240 can be a metal oxide film. The metal oxide film can be any one of titanium dioxide ($TiO_2$), zinc oxide (ZnO), zirconium dioxide ($ZrO_2$), silicon dioxide ($SiO_2$), hafnium dioxide ($HfO_2$), lanthanum oxide ($La_2O_3$), aluminum oxide ($Al_2O_3$), yttrium oxide ($Y_2O_3$), magnesium oxide (MgO), germanium oxide ($GeO_2$), strontium oxide (SrO), and lutetium oxide ($Lu_2O_3$), for example. Preferably, a dielectric material having a high band gap energy can be used for the dielectric layer 240.

The dielectric layer 240 can be obtained via high doping with a dopant. Here, the dopant can be the same as the dopant injected into the semiconductor layer 210. For instance, the dielectric layer 240 formed over an n-type semiconductor layer 210 can be highly doped with the n type. This makes it possible to obtain an even lower contact resistance, as the tunneling probability of the dielectric layer 240 is increased.

Due to the insertion of the dielectric layer 240, the MIGS phenomenon accompanying the metal-semiconductor contact can be suppressed, thereby alleviating the Fermi-level pinning phenomenon and matching the Fermi level of the semiconductor with the work function of the metal, so that the Schottky barrier may be lowered. As the dielectric layer 240 is thus inserted and the Schottky barrier is decreased, the leakage current may be suppressed, and the semiconductor component can be made to operate in an enhancement mode.

On the other hand, when the dielectric layer 240 is inserted as described above, the contact resistance at the metal-interlayer-semiconductor structure may be changed according to the thickness of the inserted dielectric layer 240. For example, in cases where the dielectric layer 240 has a large thickness, the MIGS phenomenon may be suppressed and Fermi-level pinning may be alleviated, but as the electrons face greater difficulty in tunneling through the dielectric layer 240, the contact resistance may be increased. Conversely, in cases where the dielectric layer 240 has a small thickness, the tunneling by the electrons may be easier, but the Fermi-level pinning phenomenon may not be sufficiently suppressed, so that the Schottky barrier may be increased, which in turn may also cause an increase in the contact resistance. Therefore, it is important to deposit the dielectric layer 240 in an optimum thickness for minimizing contact resistance.

Figure 6:
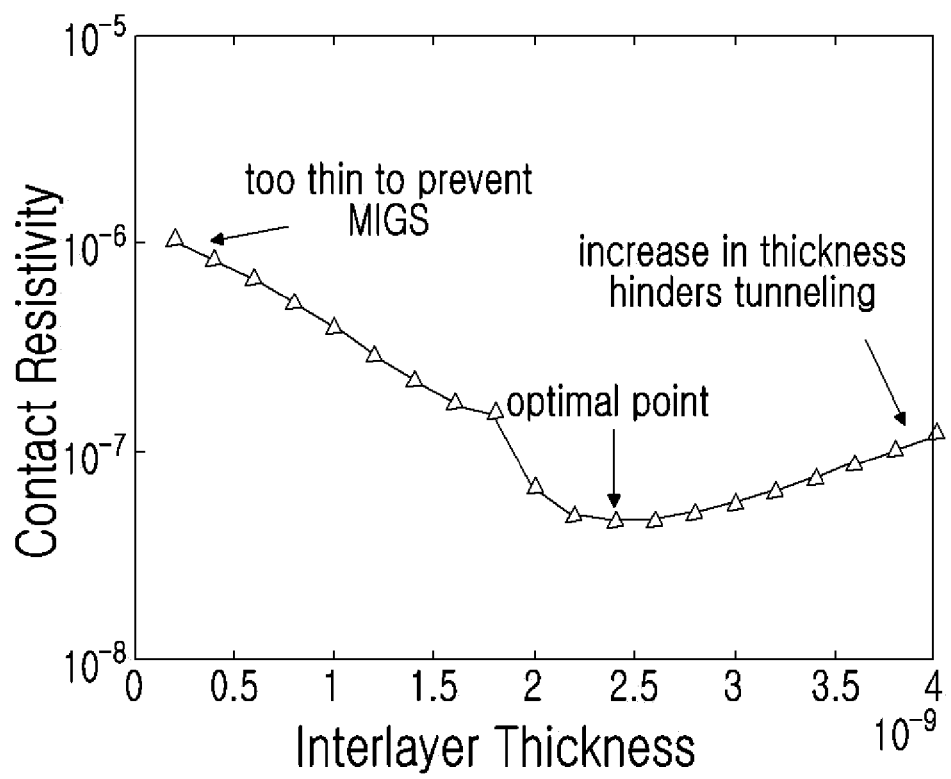
FIG. 6 is a graph illustrating changes in contact resistance according to the thickness of the dielectric layer.

Referring to FIG. 6, which illustrates changes in contact resistance according to the thickness of the dielectric layer, it can be observed that, for an example in case using ZnO for the dielectric layer 240, the contact resistance is relatively low when the thickness is 2 nm to 4 nm, and in particular, the contact resistance is the lowest when the thickness of the dielectric layer 240 is 2.4 nm. In this manner, the thickness of the dielectric layer 240 can be set to a value that minimizes the contact resistance of the metal-semiconductor according to the material of the dielectric layer 240.

The source/drain electrodes 250, 260 may each be formed on the dielectric layer 240. The source/drain electrodes 250, 260 can be the metal layers in the metal-interlayer-semiconductor structure and can be deposited onto the dielectric layer 240 by a CVD process, such as ALD, or by a PVD process, such as RF sputtering or e-beam evaporation.

To reduce the resistance of the electrode itself, the metal included in the deposited metal layer can be a metal having a low specific resistance, such as aluminum (Al), titanium (Ti), chromium (Cr), iron (Fe), cobalt (Co), nickel (Ni), copper (Cu), zinc (Zn), yttrium (Y), zirconium (Zr), niobium (Nb), ruthenium (Ru), palladium (Pd), silver (Ag), lanthanum (La), hafnium (HD, tantalum (Ta), tungsten (W), platinum (Pt), gold (Au), erbium (Er), and ytterbium (Yb), or a combination thereof. Of course, the invention is not limited to such embodiments.

Depending on the embodiment, the metal layer can include a metal nitride. The metal nitride can be a material having a metal/metalloid element and nitrogen bonded in a particular composition ratio, such as tantalum nitride (TaN), titanium nitride (TiN), hafnium nitride (HfN), and tungsten nitride (WN), for example.

In cases where the semiconductor layer 210 is of the n type, it may be preferable, in terms of reducing the contact resistance, that the metal layer be of a metal having a work function similar to the electron affinity of the semiconductor material used in the semiconductor layer 210, from among the materials listed above. In cases where the semiconductor layer 210 is of the p type, it may be preferable, in terms of reducing the contact resistance, that the metal layer be of a metal having a work function similar to a sum of the electron affinity of the semiconductor material used in the semiconductor layer 210 and the band gap energy, from among the materials listed above.

Figure 7:
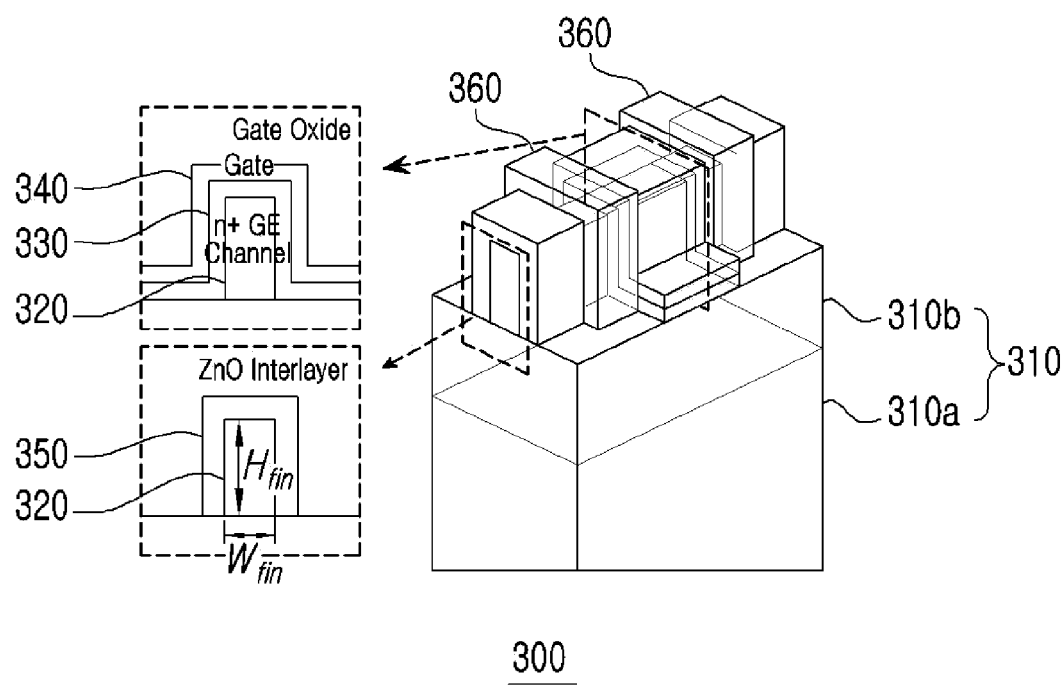
FIG. 7 is a structural diagram of a nanowire junctionless field-effect transistor according to an embodiment of the invention.

FIG. 7 is a structural diagram of a nanowire junctionless field-effect transistor according to an embodiment of the invention.

Referring to FIG. 7, a nanowire field-effect transistor 300 according to an embodiment of the invention may include a semiconductor substrate 310, a nanowire 320, a gate insulation film 330, a gate electrode 340, a dielectric layer 350, source/drain electrodes (not shown), and spacers 360.

The nanowire field-effect transistor 300 may include a nanowire 320 formed on the semiconductor substrate 310, a gate insulation film 330 formed to cover surfaces other than the surface where the nanowire 320 and the semiconductor substrate 310 are joined, a gate electrode 340 formed on the gate insulation film 330, a dielectric layer 350 formed to cover surfaces other than the surface where the nanowire 320 and the semiconductor substrate 310 are joined at both sides of the gate electrode 340, and source/drain electrodes (not shown) formed on the dielectric layer 350 at both sides of the gate electrode 340, and can further include spacers 360 at both side surfaces of the gate electrode 340 for preventing contact between the gate electrode 340 and the source/drain electrodes.

The semiconductor substrate 310 can be a SOI (silicon on insulator) substrate, for example, and can include a buried insulation film 310a and an activation layer 310b.

The nanowire 320 formed on the semiconductor substrate 310 may be made of a single dopant injected overall with the same type of impurity (n type or p type). Furthermore, the nanowire 320 can also be formed by injecting a dopant of the same type in the same concentration. The nanowire 320 can have various forms and can have a specific fin width, fin height, and fin length. Further explanation regarding the fin width, fin height, and fin length of a nanowire 320 according to an embodiment of the invention will be provided below with reference to FIG. 8A through FIG. 10B.

Figure 8A:
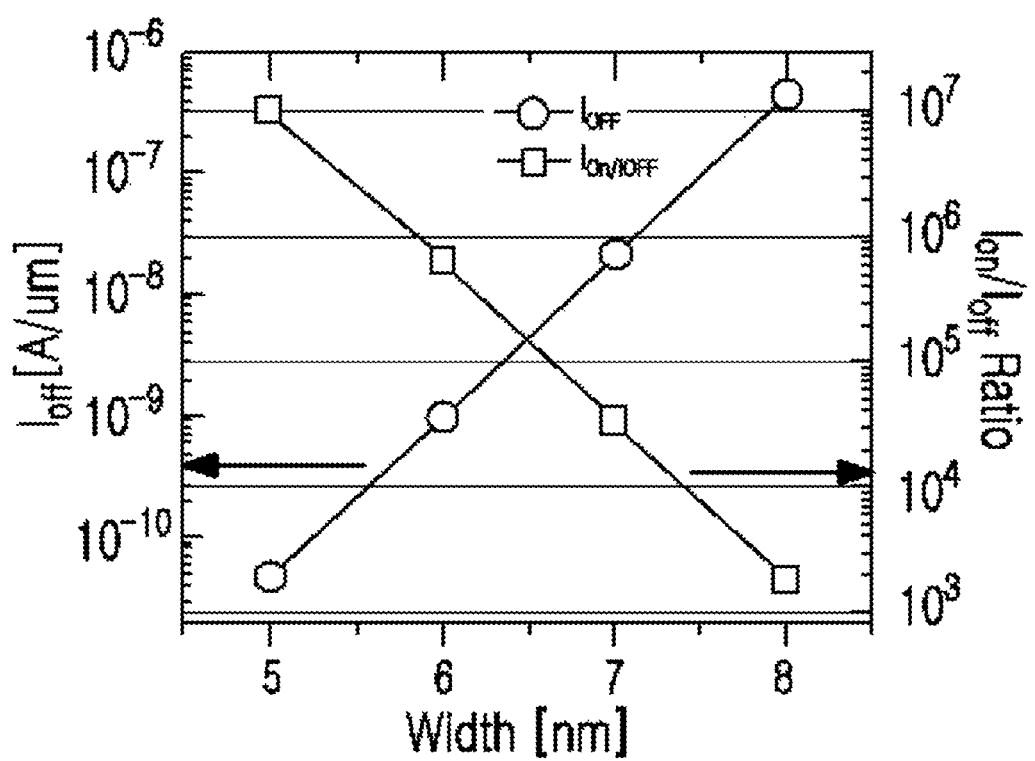
FIG. 8A is a graph illustrating changes in $I_{on}/I_{off}$ according to fin width.
Figure 8B:
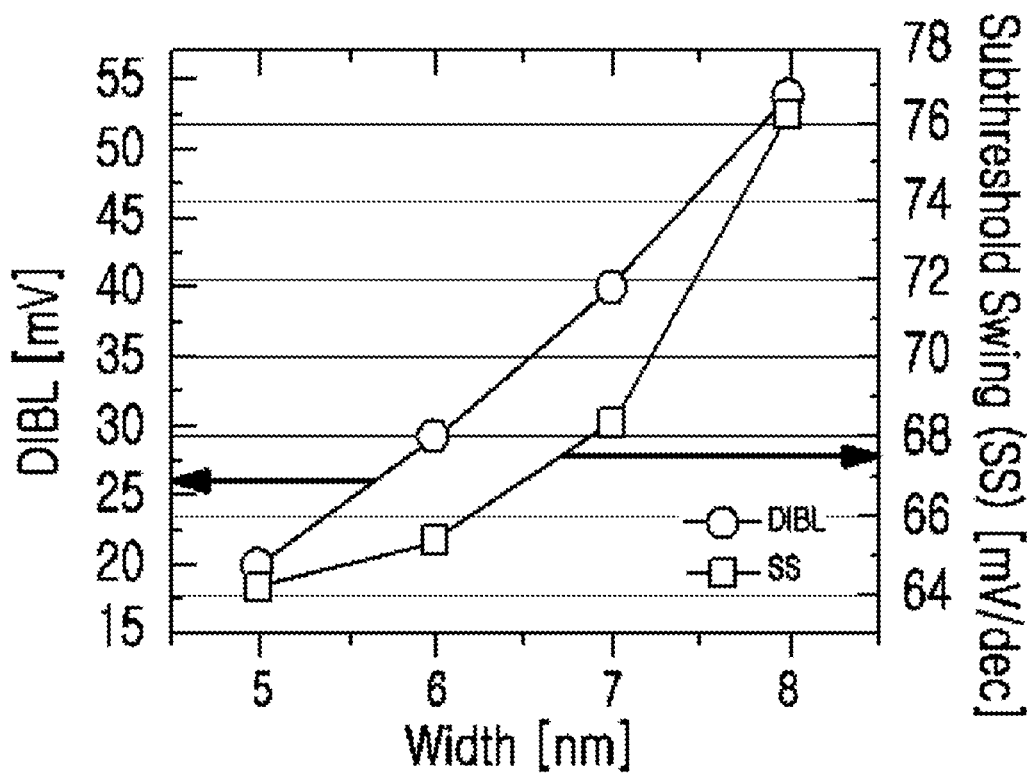
FIG. 8B is a graph illustrating changes in the SS (sub-threshold swing) and DIBL (drain induced barrier lowering) according to fin width.
Figure 9A:
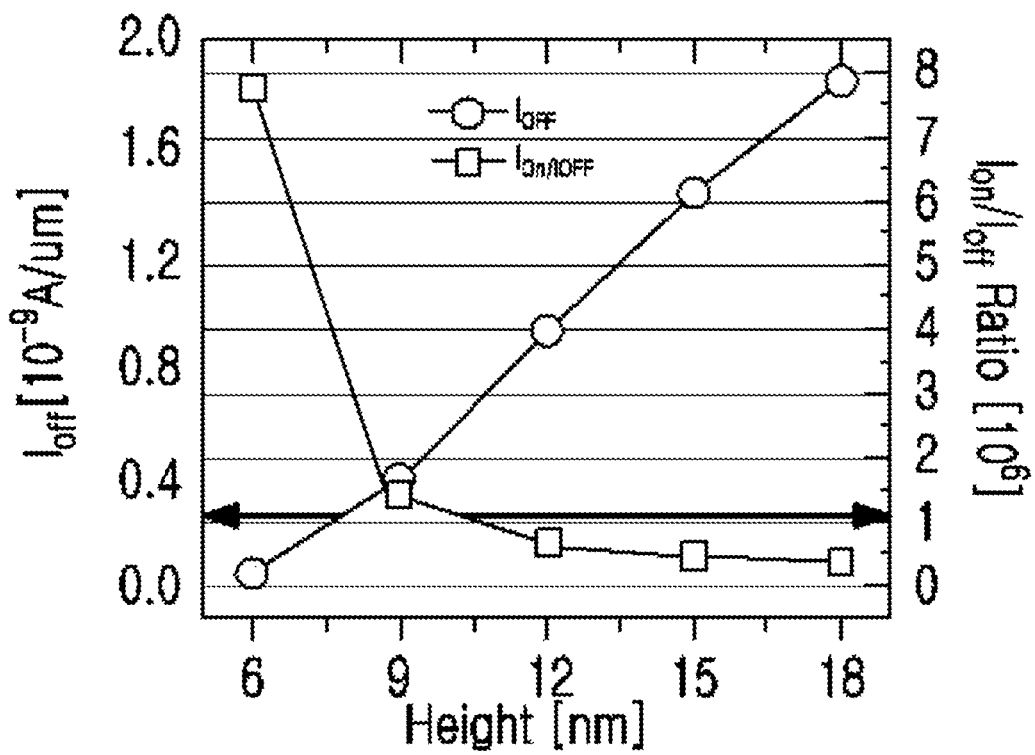
FIG. 9A is a graph illustrating changes in $I_{on}/I_{off}$ according to fin height.
Figure 9B:
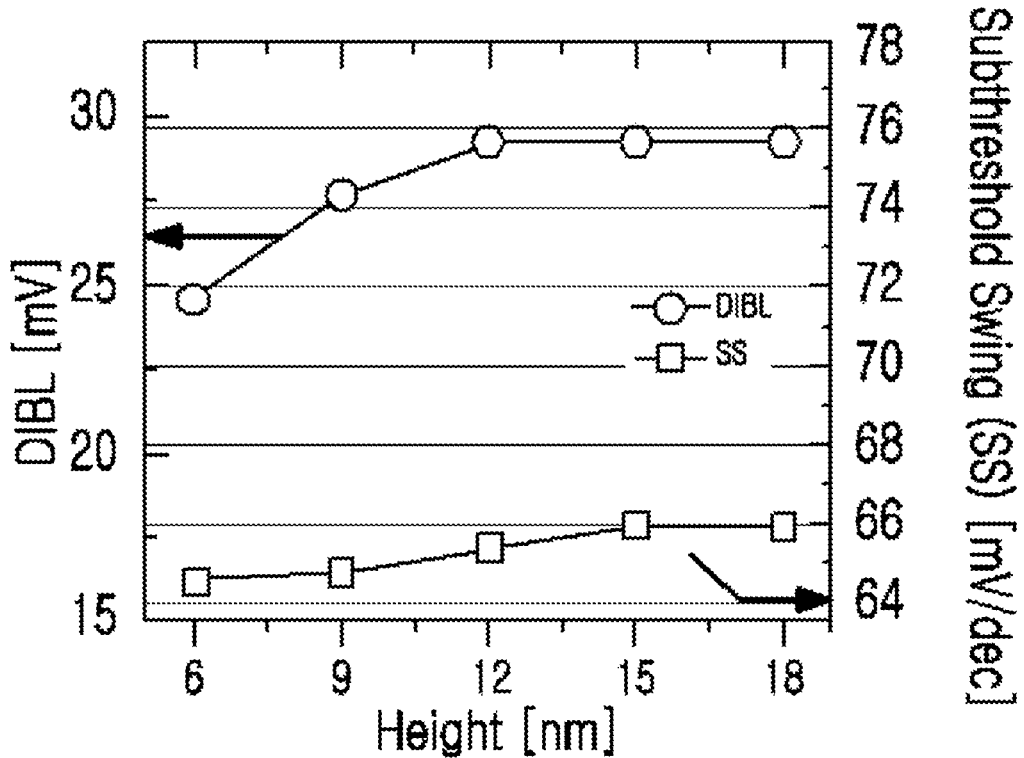
FIG. 9B is a graph illustrating changes in the SS and DIBL according to fin height.
Figure 10A:
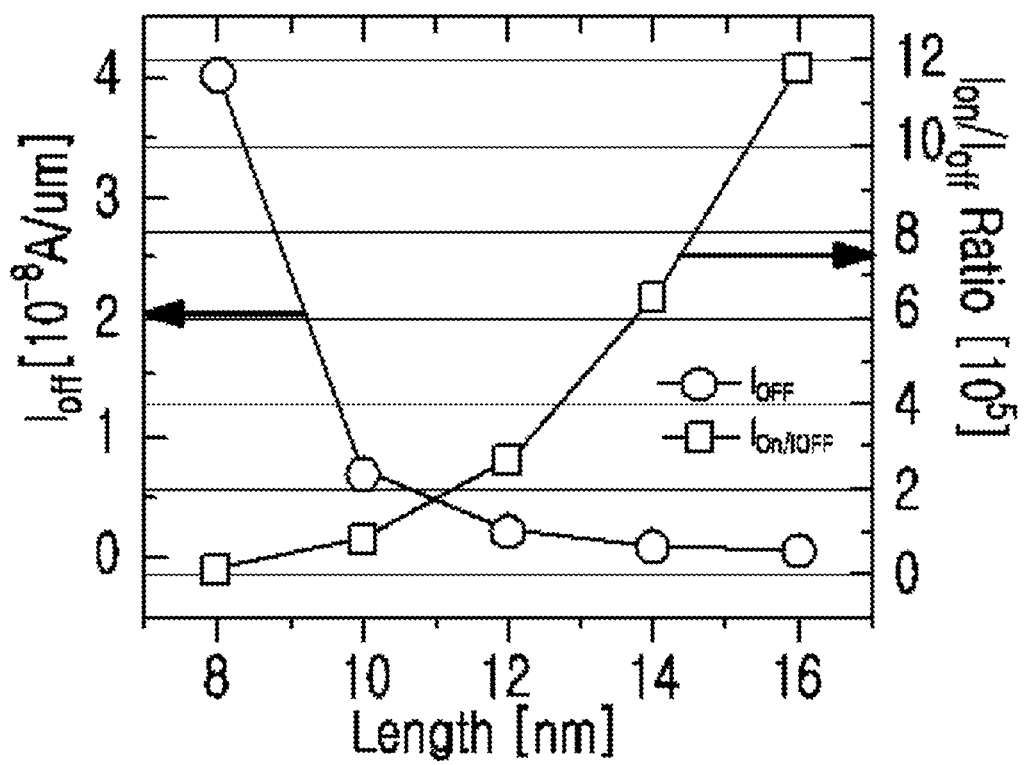
FIG. 10A is a graph illustrating changes in $I_{on}/I_{off}$ according to fin length.
Figure 10B:
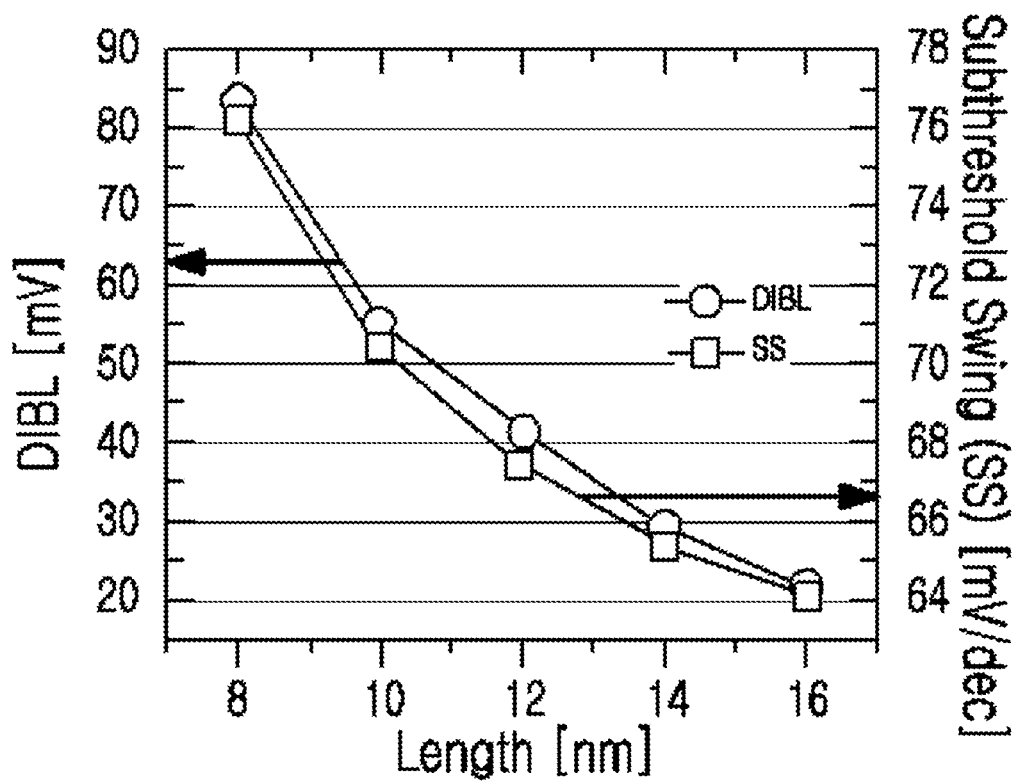
FIG. 10B is a graph illustrating changes in the SS and DIBL according to fin length.

FIG. 8A is a graph illustrating changes in $I_{on}/I_{off}$ according to fin width, FIG. 8B is a graph illustrating changes in the SS (subthreshold swing) and DIBL (drain induced barrier lowering) according to fin width, FIG. 9A is a graph illustrating changes in $I_{on}/I_{off}$ according to fin height, FIG. 9B is a graph illustrating changes in the SS and DIBL according to fin height, FIG. 10A is a graph illustrating changes in $I_{on}/I_{off}$ according to fin length, and FIG. 10B is a graph illustrating changes in the SS and DIBL according to fin length.

Referring to FIGS. 8A and 8B, an increase in fin width causes $I_{off}$ to rapidly increase, causing $I_{on}/I_{off}$ to be decreased. The width of the space-charge region, which is formed by the difference in work functions between the semiconductor and the metal forming the gate electrode 340, determines the number of carriers. Here, if the work function of the metal forming the gate electrode 340 is fixed, the width of the space-charge region may remain unchanged. Thus, an increase in the fin width may expand the area of the non-depleted region and increase $I_{off}$ to lower the gate control performance. As such, it may be preferable that the fin width of the nanowire 320 be set to or below a first threshold value, which may represent the fin width when $I_{on}/I_{off}$ becomes a particular value.

Referring to FIGS. 9A and 9B, an increase in fin height causes $I_{off}$ to increase for the same reason as explained above with regard to fin width. However, as the fin height changes only one side surface of the fin, the change in $I_{off}$ resulting from a change in fin height may not greatly affect the $I_{on}/I_{off}$ property, unlike the case of a change in fin width. Therefore, the fin height of the nanowire 320 can be set with a comparatively high degree of freedom.

Referring to FIGS. 10A and 10B, a decrease in fin length causes a decrease in the gate control performance, so that $I_{off}$ is increased, and SS and DIBL are increased as well. As such, it may be preferable that the fin length of the nanowire 320 be set to or above a second threshold value, which may represent the fin length when $I_{on}/I_{off}$ becomes a particular value.

FIGS. 11A to 11E are diagrams illustrating the manufacturing process of a junctionless field-effect transistor according to an embodiment of the invention. In the following, descriptions that are redundant over the descriptions provided above are omitted.

Figure 11A:
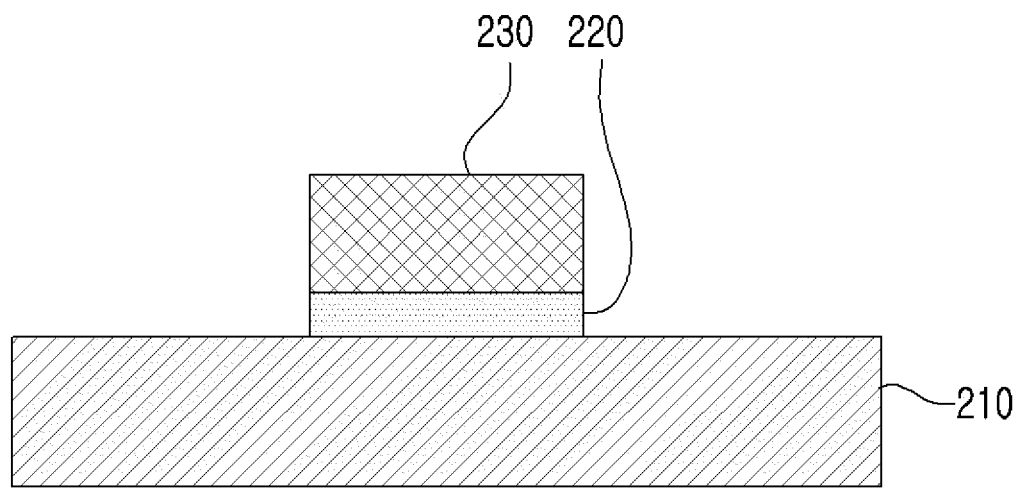
FIG. 11A, FIG. 11B, FIG. 11C, FIG. 11D, and FIG. 11E are diagrams illustrating the manufacturing process of a junctionless field-effect transistor according to an embodiment of the invention.

In FIG. 11A, a gate structure can be formed on a semiconductor substrate 210 that is injected overall with the same type of impurity (n type or p type). First, a gate insulation film 220 may be formed patterned on the semiconductor substrate 210. The gate insulation film 220 can be formed with any of a variety of deposition methods, such as for example CVD (chemical vapor deposition), LPCVD (low pressure CVD), APCVD (atmospheric pressure CVD), LTCVD (low temperature CVD), PECVD (plasma-enhanced CVD), ALCVD (atomic layer CVD), ALD (atomic layer deposition), PVD (physical vapor deposition), etc.

After forming the gate insulation film 220, the gate electrode 230 may be formed on the gate insulation film 220 with a metal material, and the formed gate electrode 230 may be etched. Here, the gate electrode 230 can be deposited by way of a conformal deposition process, such as CVD (chemical vapor deposition), ALD (atomic layer deposition), and electroless plating, or by another suitable type of deposition process.

Figure 11B:
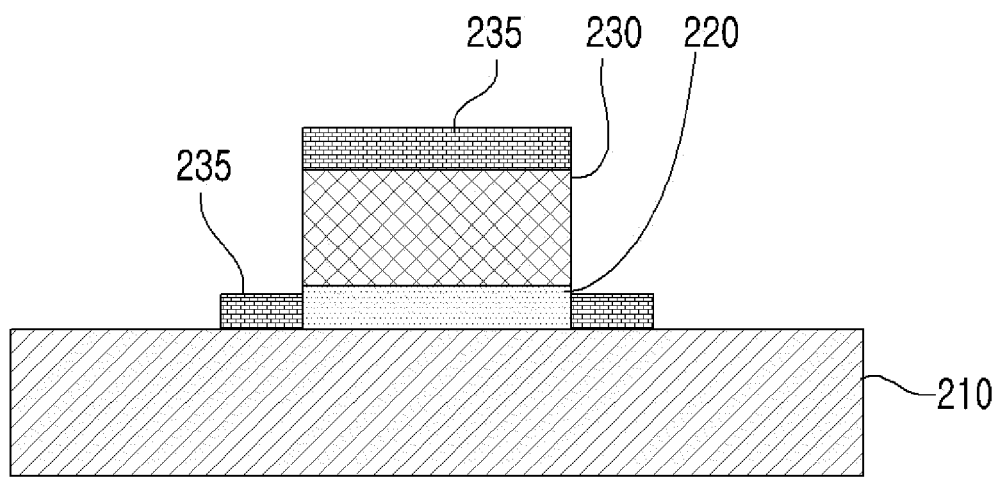

In FIG. 11B, a photosensitive insulation material 235 may be coated on the semiconductor substrate 210 on which the gate structure 220, 230 has been formed, and the photosensitive insulation material 235 may be patterned such that the source/drain regions are exposed. After the patterning, a mask may be used to expose the source/drain regions to UV irradiation.

Figure 11C:
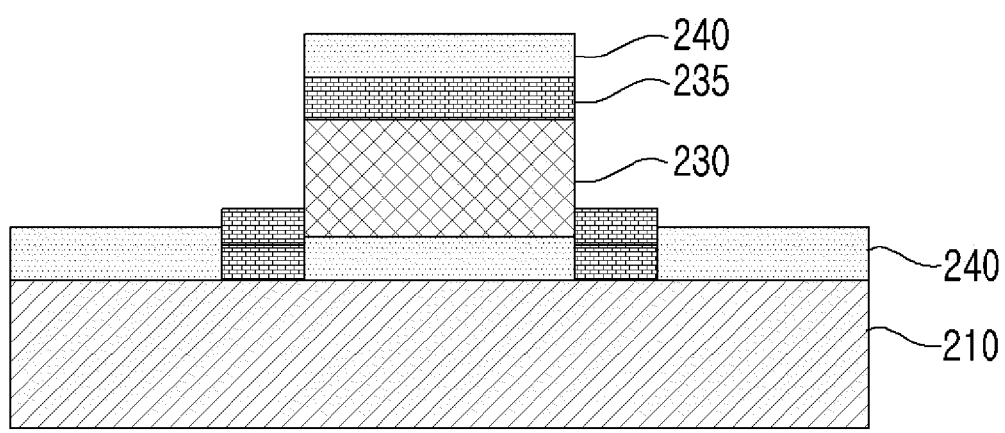

In FIG. 11C, a dielectric layer 240 may be formed in the source/drain regions. The dielectric layer 240 can be formed with the same deposition method used for forming the gate insulation film and preferably can be deposited by way of a low-temperature ALD process of 200° C. or lower.

It may be preferable that the dielectric layer 240 be deposited in a thickness that minimizes the contact resistance at the metal-semiconductor interface according to the material used for the dielectric layer 240. In one example in which the dielectric layer 240 is of ZnO, the dielectric layer 240 can be deposited in a thickness of 2 nm to 4 nm.

Figure 11D:
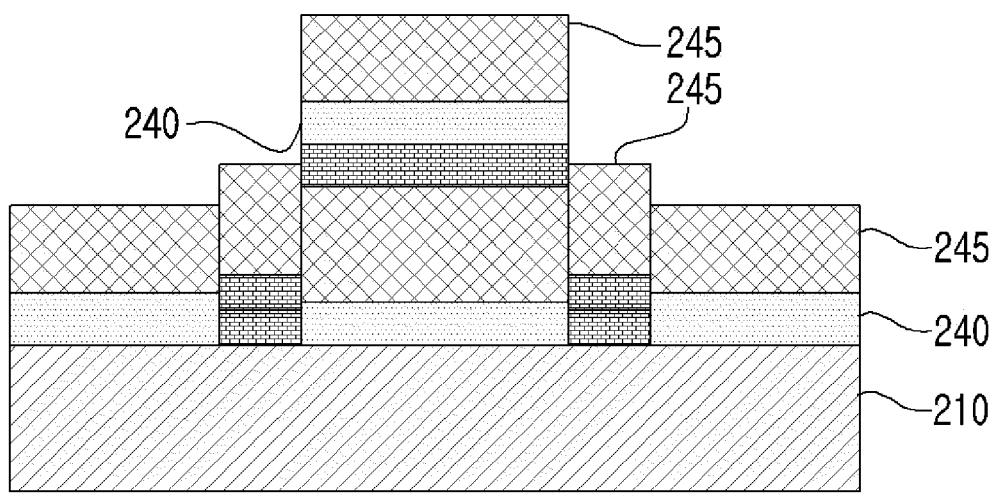
Figure 11E:
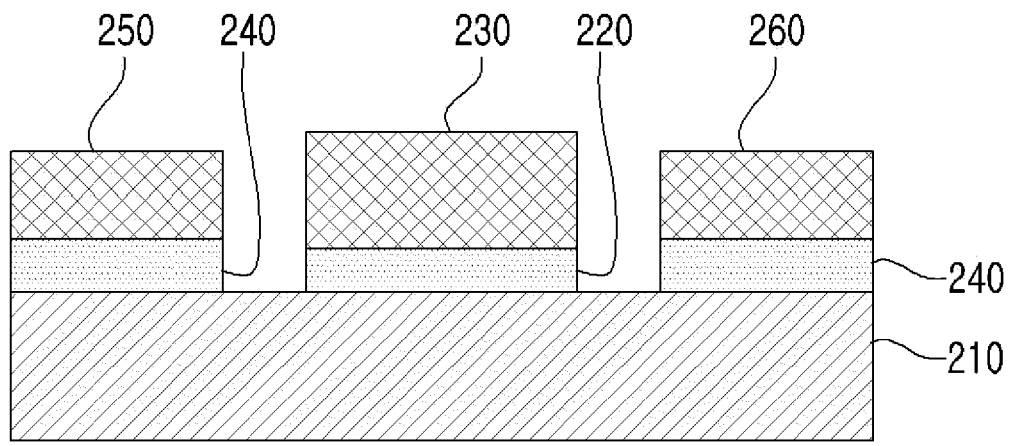

In FIGS. 11D and 11E, source/drain electrodes 250, 260 may be formed with a metal material 245 on the dielectric layer 240. The source/drain electrodes 250, 260 can be formed by depositing the metal material 245 and then etching the deposited metal material 245.

A junctionless field-effect transistor and a manufacturing method for the junctionless field-effect transistor, to which the metal-interlayer-semiconductor structure of the present invention as described above is applied, can facilitate the movement of carriers to provide a low contact resistance and can lower the Schottky barrier, so that current leakage can be reduced in the semiconductor component, and a component that could only be operated in a depleted mode can be made also to operate in an enhancement mode. This can be verified from FIG. 12 through FIG. 14B.

Figure 12:
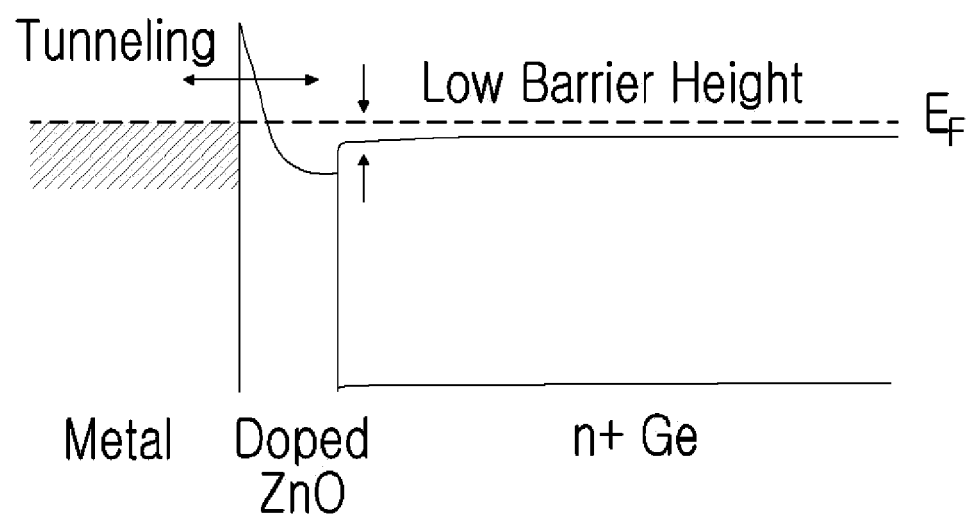
FIG. 12 illustrates the Schottky barrier of a junctionless field-effect transistor according to an embodiment of the invention.

FIG. 12 illustrates the Schottky barrier of a junctionless field-effect transistor according to an embodiment of the invention.

In contrast to FIG. 3 where a high Schottky barrier is shown, it can be seen from FIG. 12 that, in a junctionless field-effect transistor having a dielectric layer inserted in the source/drain regions, donor ions of the dielectric layer lower the potential at the semiconductor layer, so that the Schottky barrier is lowered, and the tunneling thickness is reduced as well. Thus, the metal-interlayer-semiconductor structure can provide a lower contact resistance compared to the metal-semiconductor structure.

Figure 13A:
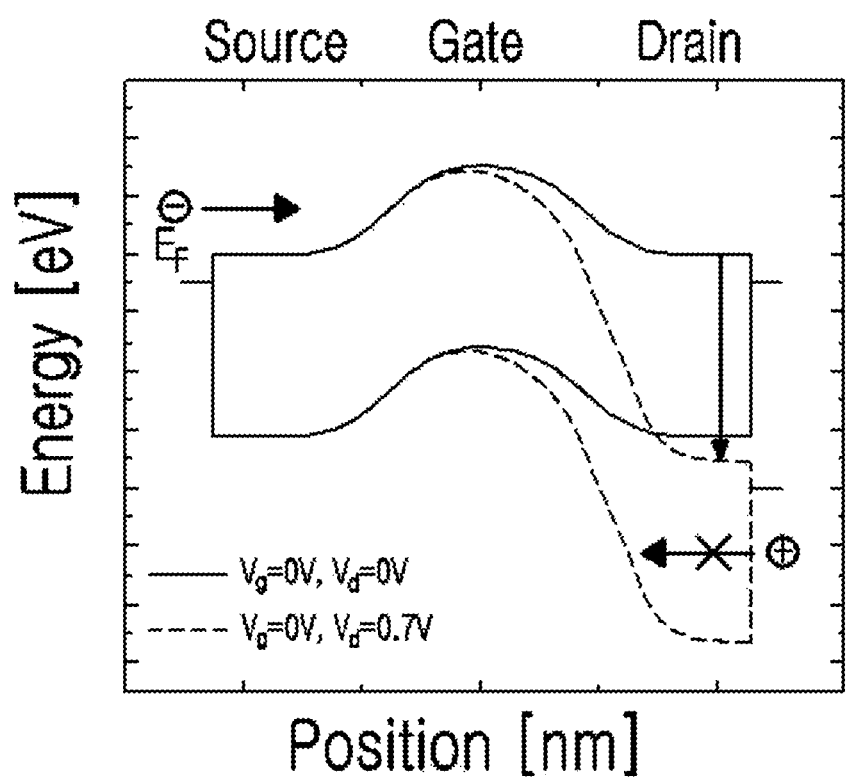
FIG. 13A and FIG. 13B show energy band diagrams for a junctionless field-effect transistor according to an embodiment of the invention.
Figure 13B:
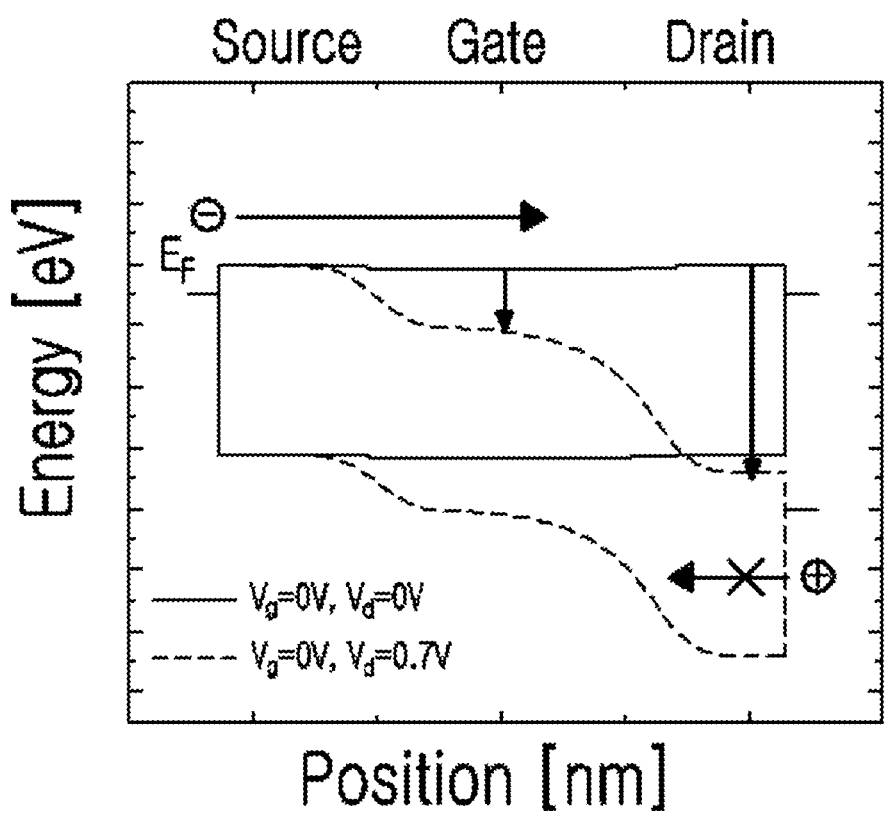

FIGS. 13A and 13B show energy band diagrams for a junctionless field-effect transistor according to an embodiment of the invention.

Referring to FIGS. 13A and 13B, when the junctionless field-effect transistor according to an embodiment of the invention is in an off mode (FIG. 13A), the height of the Schottky barrier may be lowered as Fermi-level pinning is alleviated, so that, unlike the conventional junctionless field-effect transistor, the potential of the source/drain regions may be much lower than the potential of the gate region, and an electron potential barrier may be formed in the gate region. Also, due to the low Schottky barrier, electrons may function as the major carriers of the drain current. Thus, when the gate voltage is biased, $I_{off}$ can be effectively reduced.

On the other hand, when in an on state (FIG. 13B), the gate bias may be increased, and the gate potential barrier may be lowered, enabling the carriers to effectively flow from the source to the drain. Thus, when the gate voltage is biased, it can be seen that the drain current is increased.

Figure 14A:
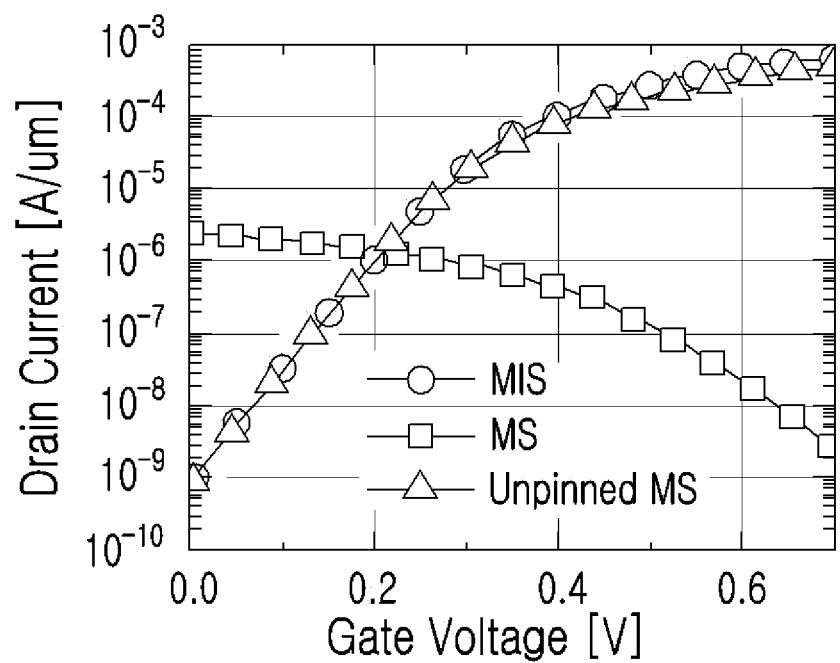
FIG. 14A and FIG. 14B show TCAD simulation results for a junctionless field-effect transistor according to an embodiment of the invention.
Figure 14B:
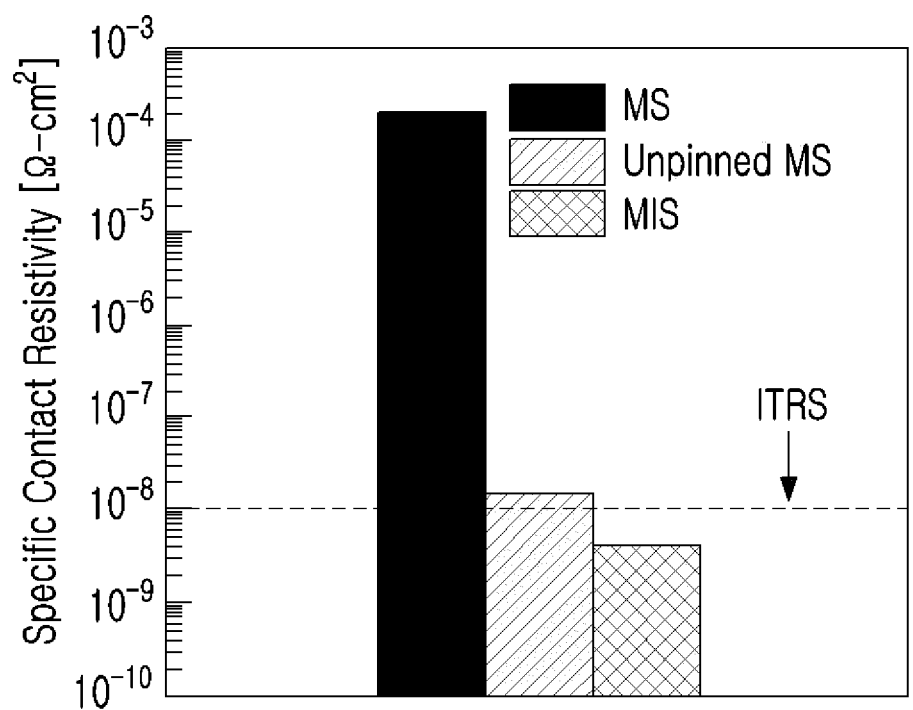

FIGS. 14A and 14B show TCAD simulation results for a junctionless field-effect transistor according to an embodiment of the invention.

Referring to FIG. 14A, in a metal-semiconductor structure, the heightened Schottky barrier causes holes to enter the channel through the source/drain, and the energy difference with the gate channel region may be decreased, resulting in an increased level of current leakage. In contrast, in a metal-interlayer-semiconductor structure, the Schottky barrier may be lowered, so that sufficient amounts of electrons enter the source/drain, and the high energy difference between the source/drain and the gate channel regions can regulate the entry of electrons to lower current leakage and enable operation in an enhancement mode.

Also, referring to FIG. 14B, it can be observed that the junctionless field-effect transistor having a metal-interlayer-semiconductor structure exhibits a lower contact resistance not only compared to a metal-semiconductor structure but also compared to a metal-semiconductor structure that does not display Fermi-level pinning.

Although the embodiments of the invention are described above with reference to limited drawings, a person having ordinary skill in the relevant field of art would be able to make various modifications and alterations from the disclosure above. For example, similarly adequate results can be achieved even if the techniques described above are performed in an order different from that disclosed, and/or if the elements of the system, structure, device, circuit, etc., are coupled or combined in a form different from that disclosed or are replaced or substituted by other elements or equivalents.

Therefore, various other implementations, various other embodiments, and equivalents of the invention disclosed in the claims are encompassed by the scope of claims set forth below.

What is claimed is:

1. A junctionless field-effect transistor comprising:
   a semiconductor layer injected with a same type of dopant;
   a gate electrode disposed on a gate insulation film disposed on the semiconductor layer;
   a dielectric layer disposed on the semiconductor layer at both sides of the gate electrode; and
   source/drain electrodes each disposed on the dielectric layer,
   wherein the dielectric layer is a metal oxide and has a thickness of 2 nm to 4 nm, and the semiconductor layer is an n-type semiconductor, and the dielectric layer is doped with an n-type material.

2. The junctionless field-effect transistor of claim 1, wherein the dielectric layer is formed by an ALD (atomic layer deposition) process.

3. The junctionless field-effect transistor of claim 1, wherein the dielectric has a thickness of 2.4 nm.

4. The junctionless field-effect transistor of claim 1, wherein the dielectric layer comprises any one of lanthanum oxide ($La_2O_3$), aluminum oxide ($Al_2O_3$), yttrium oxide ($Y_2O_3$), magnesium oxide (MgO), germanium oxide ($GeO_2$), and lutetium oxide ($Lu_2O_3$).

5. A junctionless field-effect transistor comprising:
   a semiconductor layer injected with a same type of dopant;
   a gate electrode disposed on a gate insulation film disposed on the semiconductor layer;
   a dielectric layer disposed on the semiconductor layer at both sides of the gate electrode; and
   source/drain electrodes each disposed on the dielectric layer,
   wherein the dielectric layer is a metal oxide and has a thickness of 2 nm to 4 nm, and
   the source/drain electrodes comprise any one of tantalum nitride (TaN), titanium nitride (TiN), hafnium nitride (HfN), and tungsten nitride (WN).

6. A manufacturing method for a junctionless field-effect transistor, the manufacturing method comprising:
   forming a gate structure on a semiconductor layer, the semiconductor layer injected with an n-type dopant;
   forming a dielectric layer doped with an n-type material on the semiconductor layer on both sides of the gate structure; and
   forming source/drain electrodes on the dielectric layer,
   wherein the dielectric layer is a metal oxide and has a thickness of 2 nm to 4 nm, and the dielectric layer comprises zinc oxide (ZnO).

7. The manufacturing method of claim 6, wherein the gate structure comprises:
   a gate electrode; and
   a gate insulation film formed between the gate electrode and the semiconductor layer.

8. The manufacturing method of claim 6, wherein the forming of the dielectric layer comprises forming the dielectric layer by way of an ALD (atomic layer deposition) process.

9. The manufacturing method of claim 6, wherein the dielectric layer comprises any one of lanthanum oxide ($La_2O_3$), aluminum oxide ($Al_2O_3$), yttrium oxide ($Y_2O_3$), magnesium oxide (MgO), germanium oxide ($GeO_2$), and lutetium oxide ($Lu_2O_3$).

10. A semiconductor component comprising:
    a semiconductor layer injected with a same type of dopant;

a gate electrode disposed on a gate insulation film disposed on the semiconductor layer;

a dielectric layer disposed on the semiconductor layer at both sides of the gate electrode; and source/drain electrodes each disposed on the dielectric layer, wherein the dielectric layer comprises any one of lanthanum oxide ($La_2O_3$), aluminum oxide ($Al_2O_3$), yttrium oxide ($Y_2O_3$), magnesium oxide (MgO), germanium oxide ($GeO_2$), and lutetium oxide ($Lu_2O_3$), and the semiconductor layer is an n-type semiconductor, and the dielectric layer is doped with an n-type material.

11. The semiconductor component of claim 10, wherein the dielectric layer is formed by an ALD (atomic layer deposition) process.

12. The semiconductor component of claim 10, wherein the dielectric layer further comprises hafnium dioxide ($HfO_2$).

13. The semiconductor component of claim 10, wherein the dielectric has a thickness of 2 nm to 4 nm.

14. The semiconductor component of claim 10, wherein the dielectric has a thickness of 2.4 nm.

15. A semiconductor component comprising:

a semiconductor layer injected with a same type of dopant;

a gate electrode disposed on a gate insulation film disposed on the semiconductor layer;

a dielectric layer disposed on the semiconductor layer at both sides of the gate electrode; and source/drain electrodes each disposed on the dielectric layer, wherein the dielectric layer comprises any one of lanthanum oxide ($La_2O_3$), aluminum oxide ($Al_2O_3$), yttrium oxide ($Y_2O_3$), magnesium oxide (MgO), germanium oxide ($GeO_2$), and lutetium oxide ($Lu_2O_3$), and the source/drain electrodes comprise any one of tantalum nitride (TaN), titanium nitride (TiN), hafnium nitride (HfN), and tungsten nitride (WN).

16. A junctionless field-effect transistor comprising:

a semiconductor layer injected with an n-type dopant;

a gate electrode disposed on a gate insulation film disposed on the semiconductor layer;

a dielectric layer doped with an n-type material, and disposed on the semiconductor layer at both sides of the gate electrode; and source/drain electrodes each disposed on the dielectric layer, wherein the dielectric layer is a metal oxide and has a thickness of 2 nm to 4 nm, and the dielectric layer comprises zinc oxide (ZnO).

* * * * *